(12) United States Patent
Ho et al.

(10) Patent No.: US 10,663,856 B2
(45) Date of Patent: May 26, 2020

(54) OPTICAL MASK FOR USE IN A PHOTOLITHOGRAPHY PROCESS, A METHOD FOR FABRICATING THE OPTICAL MASK AND A METHOD FOR FABRICATING AN ARRAY OF PATTERNS ON A SUBSTRATE USING THE OPTICAL MASK

(71) Applicant: City University of Hong Kong, Kowloon (HK)

(72) Inventors: Johnny Chung Yin Ho, Shatin (HK); Ming Fang, Kowloon (HK); Lei Shu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 54 days.

(21) Appl. No.: 15/685,140

(22) Filed: Aug. 24, 2017

(65) Prior Publication Data

US 2019/0064656 A1    Feb. 28, 2019

(51) Int. Cl.
*G03F 1/50* (2012.01)
*G03F 7/00* (2006.01)
*G03F 7/20* (2006.01)

(52) U.S. Cl.
CPC .............. *G03F 1/50* (2013.01); *G03F 7/0002* (2013.01); *G03F 7/0015* (2013.01); *G03F 7/70275* (2013.01); *G03F 7/70283* (2013.01)

(58) Field of Classification Search
CPC ........ G03F 1/50; G03F 7/0015; G03F 7/0002; G03F 7/70283; G03F 7/70275
USPC ....................................... 430/5, 30
See application file for complete search history.

(56) References Cited

U.S. PATENT DOCUMENTS

2012/0299222 A1    11/2012  Lan

FOREIGN PATENT DOCUMENTS

| CN | 102903608 | 7/2011 |
|---|---|---|
| CN | 102360161 | 10/2011 |
| CN | 102544264 | 1/2012 |
| CN | 103579434 | 11/2013 |
| CN | 104900489 | 4/2015 |
| CN | 104698742 | 6/2015 |
| CN | 105226144 | 11/2015 |
| CN | 105304775 | 11/2015 |
| CN | 105355745 | 12/2015 |
| CN | 105576097 | 2/2016 |

*Primary Examiner* — Christopher G Young
(74) *Attorney, Agent, or Firm* — Renner Kenner Greive Bobak Taylor & Weber (57) ABSTRACT

An optical mask for use in a photolithography process, a method for fabricating the optical mask, and a method for fabricating an array of patterns on a substrate using the optical mask, wherein the optical mask includes an array of microstructures disposed on a mask substrate, and wherein the array of microstructures is arranged to transform a uniform optical exposure passing therethrough to an array of optical exposure patterns.

14 Claims, 10 Drawing Sheets
(1 of 10 Drawing Sheet(s) Filed in Color)

OPTICAL MASK FOR USE IN A PHOTOLITHOGRAPHY PROCESS, A METHOD FOR FABRICATING THE OPTICAL MASK AND A METHOD FOR FABRICATING AN ARRAY OF PATTERNS ON A SUBSTRATE USING THE OPTICAL MASK

TECHNICAL FIELD

The present invention relates to an optical mask for use in a photolithography process, a method for fabricating the optical mask and a method for fabricating an array of patterns on a substrate using the optical mask, although not exclusively, to a method for fabricating patterned substrates using an optical mask.

BACKGROUND

As night activities are becoming more common and that better technologies are being developed such that different properties of lighting apparatus are required, such as broad-beamed, high intensity floodlight for nighttime luminance and coherent, more variations of lighting apparatus are being developed for different purposes. LED may be used in a wide range of applications due to its low-cost, high energy efficiency. For example, it may be used as headlights or flashlights. LED may also be used as backlights in display panels.

Despite a high energy efficiency of LED lighting, a considerable amount of photons are still lost to the surroundings, or say the escape cone, due to the refractive properties of the medium. Due to total internal refraction, which is the reflection of photons upon entering a different medium with a lower refractive index, these reflected photons do not contribute to the desired illumination which the LED provides.

Patterned sapphire substrate (PSS) technique may be employed to improve the luminosity and light extraction efficiency. By applying a nano-array of structures on the photon escaping interface between the two mediums, i.e. sapphire and air, more photons may be extracted from the escape cone than from a flat surface, achieving an overall brighter LED.

SUMMARY OF THE INVENTION

In accordance with a first aspect of the present invention, there is provided an optical mask for use in a photolithography process, comprising an array of microstructures disposed on a mask substrate, wherein the array of microstructures is arranged to transform a uniform optical exposure passing therethrough to an array of optical exposure patterns.

In an embodiment of the first aspect, each of the microstructures is arranged to at least partially converge the uniform optical exposure thereby forming the array of optical exposure patterns.

In an embodiment of the first aspect, the array of microstructures defines a self-assembly monolayer of microstructures on the mask substrate.

In an embodiment of the first aspect, each of the microstructures includes a refractive index equals to or larger than 1.4.

In an embodiment of the first aspect, each of the microstructures includes a spherical shape.

In an embodiment of the first aspect, the array of optical exposure patterns includes a pitch determined by a diameter of the microstructures.

In an embodiment of the first aspect, each of the microstructures includes a diameter of 250 nm-2000 nm.

In an embodiment of the first aspect, each of the microstructures includes a material of polystyrene, poly(methyl methacrylate) (PMMA) or polycarbonates.

In an embodiment of the first aspect, the mask substrate includes polydimethylsiloxane (PDMS).

In an embodiment of the first aspect, the optical mask is reusable.

In accordance with a second aspect of the present invention, there is provided a method for fabricating an optical mask for use in a photolithography process, comprising the steps of: disposing an array of microstructures on an intermediate substrate; and the microstructures from the intermediate substrate to a mask substrate; wherein the array of microstructures is arranged to transform a uniform optical exposure passing therethrough to an array of optical exposure patterns.

In an embodiment of the second aspect, the array of microstructures defines a self-assembly monolayer of microstructures.

In an embodiment of the second aspect, the method further comprises the step of forming the self-assembly monolayer of microstructures on a solution surface.

In an embodiment of the second aspect, the step of disposing the array of microstructures on the intermediate substrate comprises the step of transferring the self-assembly monolayer of microstructures from the solution surface to the intermediate substrate.

In an embodiment of the second aspect, the method further comprises the step of processing the microstructures with oxygen plasma.

In an embodiment of the second aspect, the step of transferring the microstructures from the intermediate substrate to the mask substrate comprises the steps of forming the mask substrate on top of the array of microstructures on the intermediate substrate; and detaching the intermediate substrate from a combination of the array of microstructure and the mask substrate.

In an embodiment of the second aspect, the step of forming the mask substrate comprises the step of curing a precursor of the mask substrate applied over the array of microstructures on the intermediate substrate.

In an embodiment of the second aspect, the step of detaching the intermediate substrate from a combination of the array of microstructure and the mask substrate comprises the step of peeling off the mask substrate from the intermediate substrate so as to detach the microstructure from the intermediate substrate.

In an embodiment of the second aspect, the intermediate substrate includes an interfacial metal layer arrange to facilitate transferring the microstructures from the intermediate substrate to a mask substrate.

In an embodiment of the second aspect, the interfacial metal layer includes a low affinity to the mask substrate.

In accordance with a third aspect of the present invention, there is provided a method for fabricating an array of patterns on a substrate, comprising the steps of depositing a layer of photo-sensitive material on the substrate; exposing the layer of photo-sensitive material with a uniform optical exposure passing through an optical mask; and developing an array of intermediate patterns on the layer of photo-sensitive material; wherein the optical mask includes an array of microstructures disposed on a mask substrate; and wherein the array of microstructures is arranged to transform the uniform optical exposure passing therethrough to an array of optical exposure patterns.

In an embodiment of the third aspect, each of the microstructures is arranged to at least partially converge the uniform optical exposure thereby forming the array of optical exposure patterns, so as to develop the array of intermediate patterns on the layer of photo-sensitive material upon a development process.

In an embodiment of the third aspect, the method further comprises the step of etching a layer of material underneath the photo-sensitive material so as to transfer the intermediate patterns developed on the photo-sensitive material to the layer of material.

In an embodiment of the third aspect, the layer of material underneath the photo-sensitive material is an etching mask layer.

In an embodiment of the third aspect, the method further comprises the step of transferring the intermediate patterns to a layer of material deposited on the layer of photo-sensitive material by a lift-off process.

In an embodiment of the third aspect, the substrate includes sapphire.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that LEDs may be used as a standard light source for a wide range of products from general lighting all the way to backlighting for consumer electronics involving HDTVs and others. To further improve the performance or the efficiency of LEDs, pattern sapphire substrates may be used to maximize light extraction and tackle issues to broader LED usage.

For example, periodic nanostructures may be defined on sapphires by reactive ion etching with patterned photoresist (PR) mask on top of substrates to obtain patterned sapphire substrates (PSS).

Figure 1A:
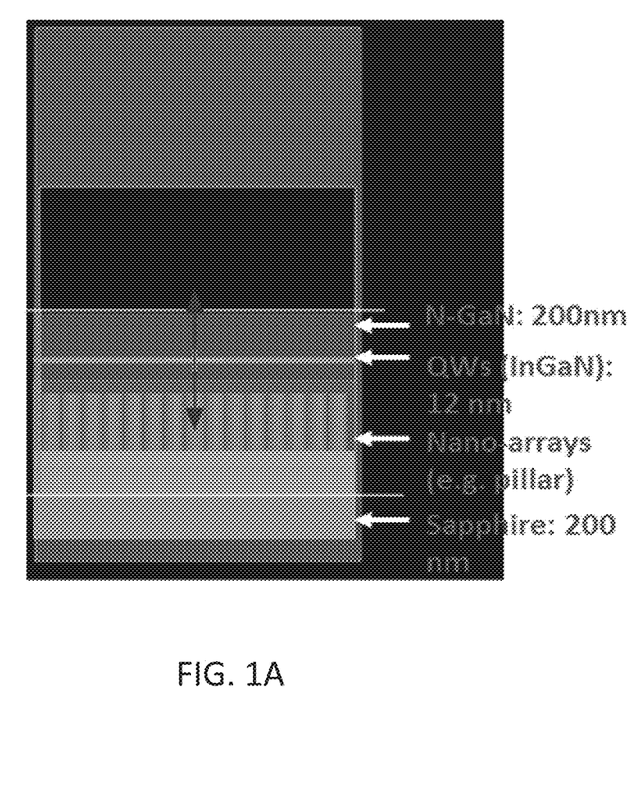
FIG. 1A is a schematic diagram showing an example GaN/InGaN MQW LED device structure.
Figure 1B:
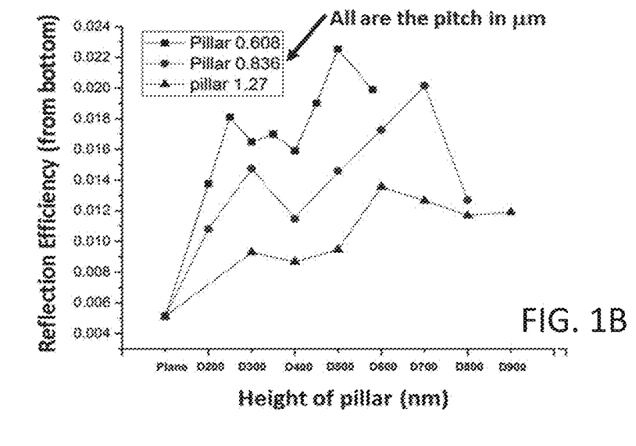
FIGS. 1B and 1C are plots showing simulated reflection efficiency of various nano-PSS patterns used for the performance evaluation of the example LED structure of FIG. 1A.
Figure 1C:
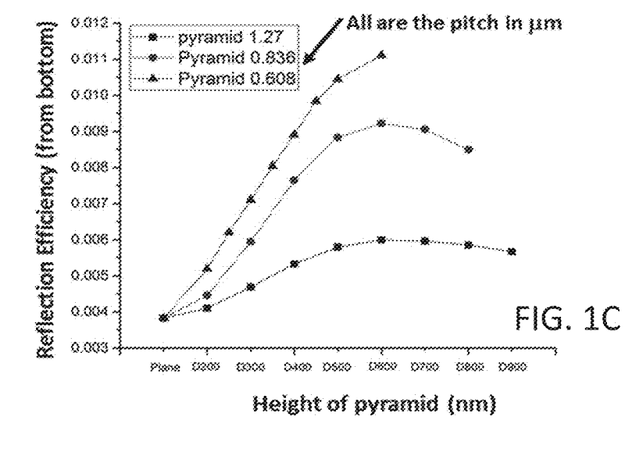

With reference to FIGS. 1A to 1C, there is shown the effect of light reflection in the substrate based on an optical simulation experiment. These simulation results may guide the pattern design for the optimal nanostructured arrays on sapphires for the fabrication of nano-PSS with enhanced LED performances.

By employing the Finite-Difference-Time-Domain (FDTD) simulation package, GaN/InGaN LED structures are modelled on sapphire substrates surface-texturized with different nano-arrays. Referring to FIGS. 1B and 1C, both nanopillar and nanopyramid arrays with different geometrical pitch and height are investigated for the nano-PSS fabrication for the optimal reflection efficiency from the bottom reference plane (i.e. luminescence efficiency).

Without wishing to be bound by theory, the pillar structure would yield the better reflection efficiency than the one of pyramid. The optimized pillar structure (i.e. 600 nm pitch and 500 nm height) may deliver a best reflection efficiency for the LED structure in FIG. 1A, which contributes to an improvement of more than 400% as compared to the planar substrate.

In this regard, creating accurate and uniform high-precision nanostructures in the PR mask with low-cost and high-throughput process is essential but still a challenge for the PSS fabrication.

Figure 2A:
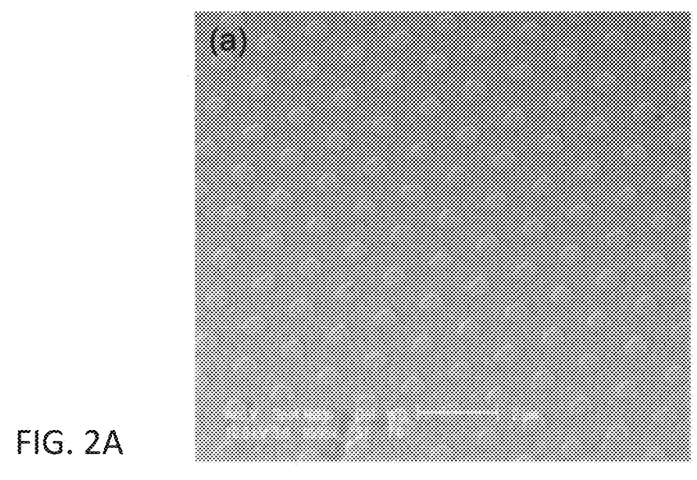
FIGS. 2A, 2B, and 2C are SEM and AFM images showing an example nano-arrays obtained on sapphire substrate.
Figure 2B:
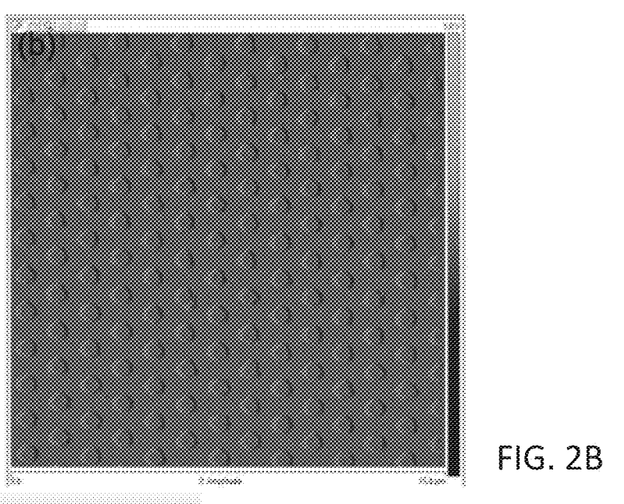
Figure 2C:
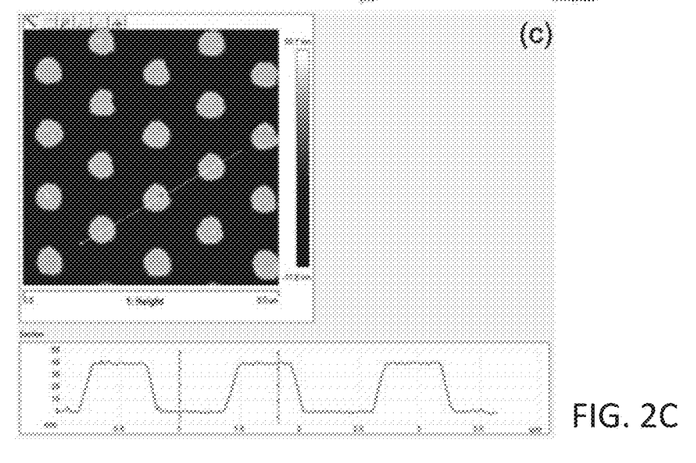

In an example embodiment, with reference to FIG. 2, nanostructured arrays (100 mm in diameter) may be fabricated on sapphire substrates to obtain a nano-PSS. In this example, after the nanopatterns are transferred onto the $SiO_2$ masking layer, utilizing the wet etching, nano-arrays are obtained with an average height of 40.0 nm and a standard deviation of 0.62 nm, corresponding to the coefficient of variation (CV) of 1.6%.

Figure 3:
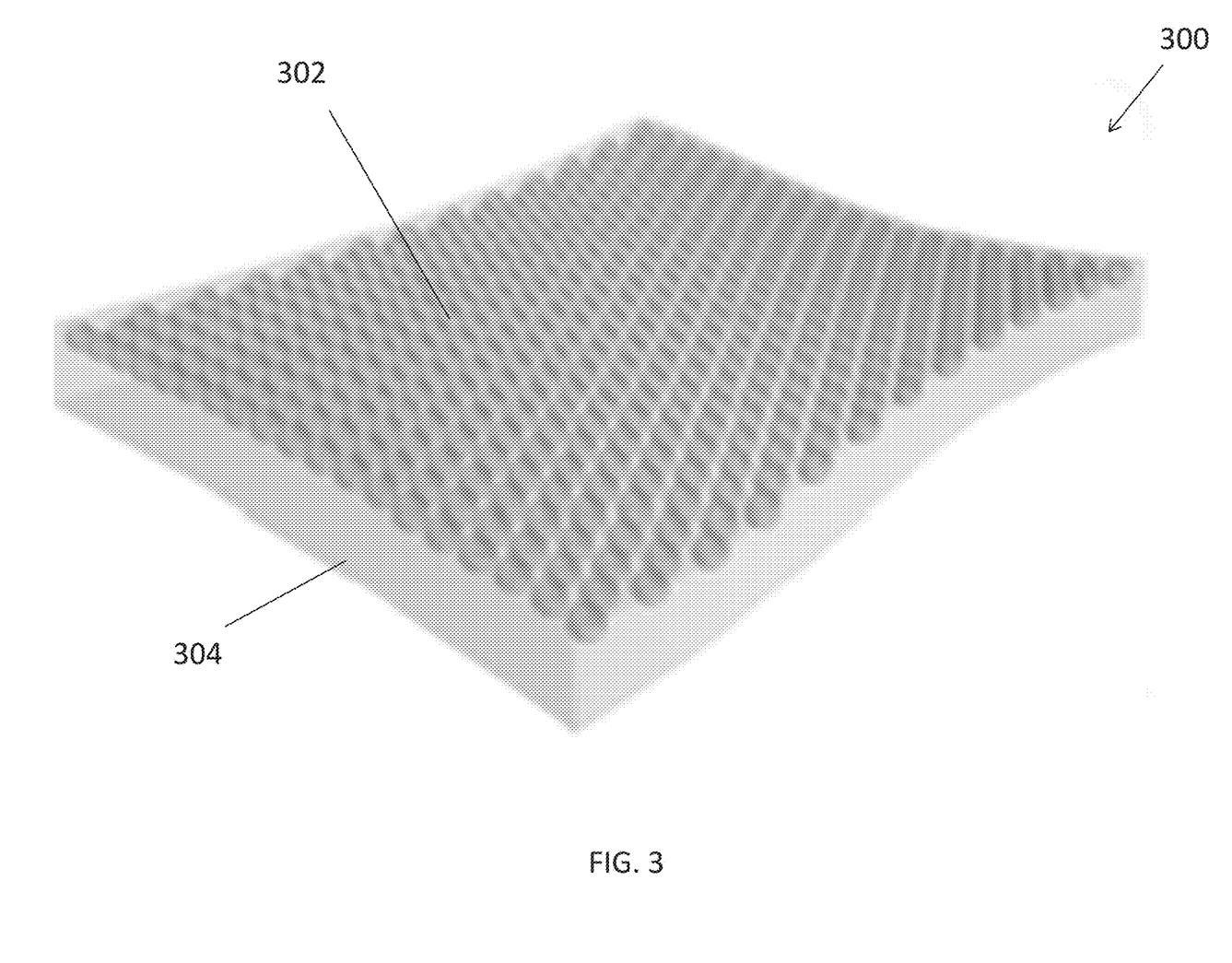
FIG. 3 is a perspective view of an optical mask for use in a photolithography process in accordance with an embodiment of the present invention.

With reference to FIG. 3 there is shown an example embodiment of an optical mask 300 for use in a photolithography process, comprising an array of microstructures 302 disposed on a mask substrate 304, wherein the array of microstructures 302 is arranged to transform a uniform optical exposure passing therethrough to an array of optical exposure patterns.

In this embodiment, the optical mask 300 comprises substantially two layers of material including a mask substrate 304 and a plurality of microstructures 302 arranged in a monolayer. The microstructures 302 are fixedly disposed on the mask substrate 304 such that the optical mask 300 may be reusable for fabricating multiples patterned substrates.

Preferably, the mask substrate 304 includes a polymer film such as a polydimethylsiloxane (PDMS) film arranged to hold the microstructures 302 thereon. The PDMS film 304 may include a thickness of 300 µm to 2000 µm so as to provide sufficient mechanical strength for using and reusing the optical mask 300 in a fabrication process of a patterned substrate, such as in a photolithography process in which the optical mask 300 may be used to define the exposure patterns on a photoresist layer.

Referring to FIG. 3, the optical mask 300 comprises a plurality of microstructures 302 disposed on the PDMS substrate 304. The microstructures 302 are provided as nano-spheres each includes a substantial spherical shape with uniform size or diameter ranging from 250 nm-2000 nm.

Both the PDMS film 304 and the microstructures 302 may be transparent with respect to the optical spectrum of the exposure source in the photolithography process, for example in the UV range with peak intensity at 365 nm (the "i-line") and/or any other ranges/values (such as "g-line" and "h-line") as appreciated by a skilled person in the photolithography technology.

Preferably, the microstructures 302 includes a refractive index equals to or larger than 1.4 such that each of the nano-spheres may operate as an optical micro-lens. Each of the microstructures 302 or the nano-spheres may at least partially converge a uniform optical exposure passing through the optical mask 300, thereby forming the array of optical exposure patterns. For example, each of the nano-spheres 302 is operable to focus the incoming uniform UV exposure, such that an array of focused UV spots may be delivered to substrate underneath the optical mask 300. The microstructures 302 may include materials of polystyrene (PS), poly(methyl methacrylate) (PMMA) or polycarbonates (PC), or any other material and/or refractive indices which is suitable for converging or focusing the light exposures.

The nano-spheres 302 are arranged as a substantially regular and periodic array in a single layer. Preferably, such single layer of microstructures 302 may be produced using a self-assembly monolayer fabrication technique in which all the microstructures 302 are closely packed together. In this regard, the array of optical exposure patterns converted by the microstructure array includes a pitch determined by a diameter of the microstructures 302 or the nano-spheres. For example, an array of pattern developed on the photoresist includes a pitch of 500 nm if an optical mask 300 including a monolayer of nano-spheres 302 with 500 nm diameter is used in the UV exposure step. On the other hand, the size of the developed patterns (on the photoresist and/or the layer with the transferred patterns) may be adjusted in accordance with different exposure and developing conditions and parameters.

Figure 4:
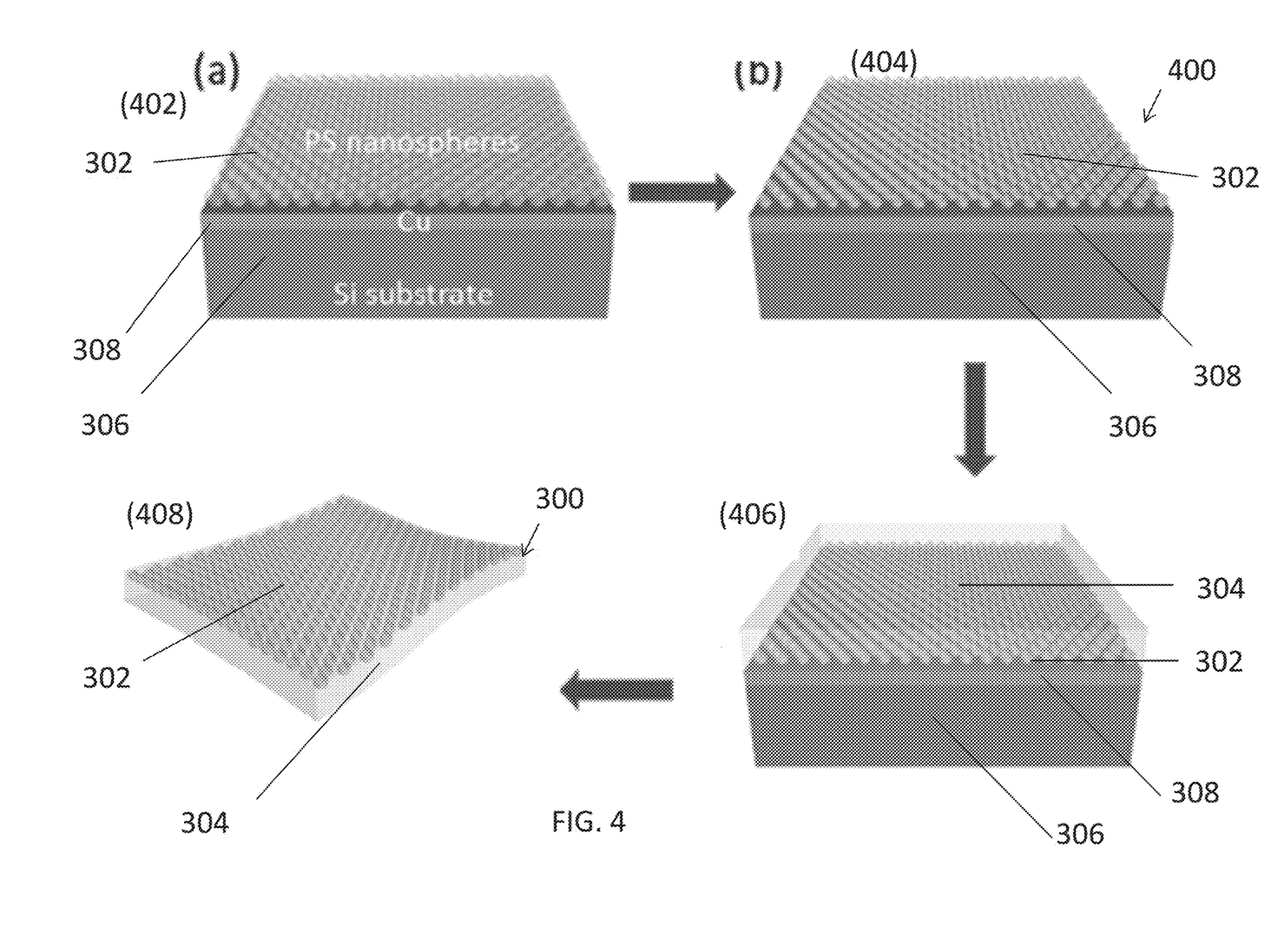
FIG. 4 is a process flow diagram showing an example fabrication process of the optical mask of FIG. 3 in accordance with an embodiment of the present invention.

With reference to FIG. 4, there is shown an embodiment of fabricating an optical mask 300 for use in a photolithography process. The method 400 comprises the steps of disposing an array of microstructures 302 on an intermediate substrate; and transferring the microstructures 302 from the intermediate substrate to a mask substrate 304; wherein the array of microstructures 302 is arranged to transform a uniform optical exposure passing therethrough to an array of optical exposure patterns.

In this embodiment, in step 402, an array of microstructures 302 is formed using a solution process to define a self-assembly monolayer of microstructures 302, and the array of microstructures 302 may then be further transferred to an intermediate substrate 306 having a substantially flat surface, such as a surface of a silicon substrate or a glass substrate.

For example, a solvent or a mixture containing a plurality of nano-spheres 302 may be dropped or applied to a solution (or water) such that the self-assembly monolayer of microstructures 302 may be formed on the solution surface. Then the intermediate substrate 306 may be raised to the surface of the solution to contact with the monolayer of microstructures 302, such that the microstructures 302 may be transferred to the intermediate substrate 306.

The transferred monolayer of microstructures 302 may be dried in ambient or in a chamber with controlled temperature and humidity. In step 404, an oxygen plasma process may be performed to the monolayer of microstructures 302 on the intermediate substrate 306. Oxygen plasma may react with organic materials and introduce oxygen-containing polar groups at the surface of the organic material. It is also found that prolonged plasma treatment may reduce the size of the polymeric nano-spheres 302 in response to an etching effect induced by the oxygen plasma. As a result, the plasma treatment to the spheres 302 may enhance the mechanical robustness of the optical mask 300 by increasing the filling ratio of the mask substrate 304, i.e. PDMS material, among the microstructures 302 and enhancing the chemical bonding of the spheres 302 to the mask substrate material through the plasma-induced polar groups.

After the oxygen plasma treatment process, in step 406, the layer of microstructures 302 may be further transferred to the mask substrate 304. Preferably, the mask substrate 304 may be formed directly on top of the array of microstructures 302 on the intermediate substrate 306 using a polymerization method, such as by curing a precursor of the mask substrate 304 (such as PDMS prepolymer mixture) applied over the array of microstructures 302 on the intermediate substrate 306. After the curing of the PDMS mask substrate, in step 408, the mask substrate 304 may be peeled off from the intermediate substrate 306 so as to detach the microstructures 302 from the intermediate substrate 306 to obtain an optical mask 300 combining the array of microstructure and the mask substrate 304.

To further enhance the dethatching of the fabricated mask substrate 304 from the intermediate substrate 306, preferably, the intermediate substrate 306 may include an interfacial metal layer 308 which may have a low affinity to the mask substrate 304, so as to facilitate transferring the microstructures 302 from the intermediate substrate 306 to a mask substrate 304. For example, a thickness of 50 nm-100 nm metal such as Cu, Ag, Au and/or Pt may be deposited to the base silicon or glass substrate prior to transferring the SAM nano-spheres from the solution surface to the intermediate substrate 306. This may effectively prevent cracking of the intermediate substrate 306 during dethatching of the fabricated optical mask 300 from the base substrate.

In one example fabrication process, an interfacial metal layer 308 may be first deposited on a silicon or glass substrate 306. Monodispersed polystyrene (PS) colloidal suspensions may be mixed with proper amounts of alcohol (including ethanol, methanol and isopropanol). The mixture may be slowly dropped into deionized (DI) water through a tilted glass slide. The floating PS spheres 302 may be further compressed on the water surface either by using a PTFE bar or adding a few drops (0.001% to 10% by weight) of anionic surfactant solutions, such as sodium dodecyl sulphate or any surfactant being anionic.

The metal-coated substrate 306 may be inserted underneath the close-packed monolayer 302, and raising the substrate 306 enabling transfer of the monolayer from the water surface to the intermediate substrate 306. The transferred PS monolayer 302 is left dry naturally in ambient environment and then treated with oxygen plasma for 10-300 seconds.

Polydimethylsiloxane (PDMS) prepolymers (1:10 by weight of the curing agent and monomer) may be mixed in a beaker, subsequently casted over the plasma-treated nanospheres 302 in a Petri dish, and the polymer 304 may be cured at 60-150° C. for 2 hours or more. Finally, the cured PDMS film 304 may be peeled off manually from the substrate 306 after cutting the edge using a blade.

Figure 5:
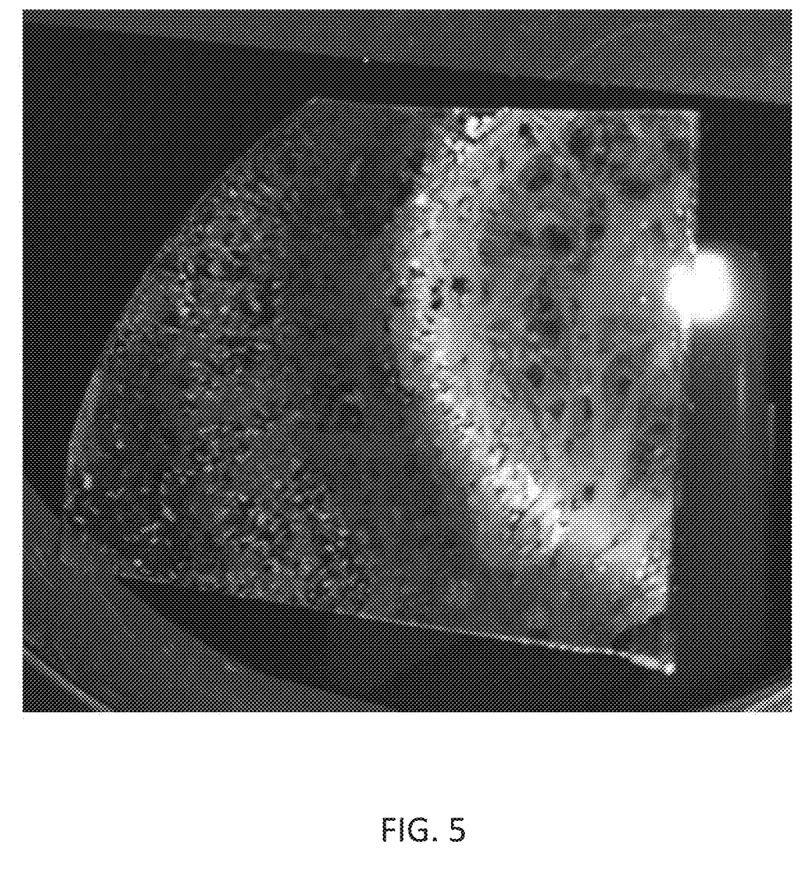
FIG. 5 is a photographic image showing an as-fabricated optical mask of FIG. 3 used in a photolithography process.

With reference to FIG. 5, there is shown an as-fabricated optical mask 300, in which the diffraction colours on the optical mask 300 indicate a long-range order of the pattern.

Figure 6:
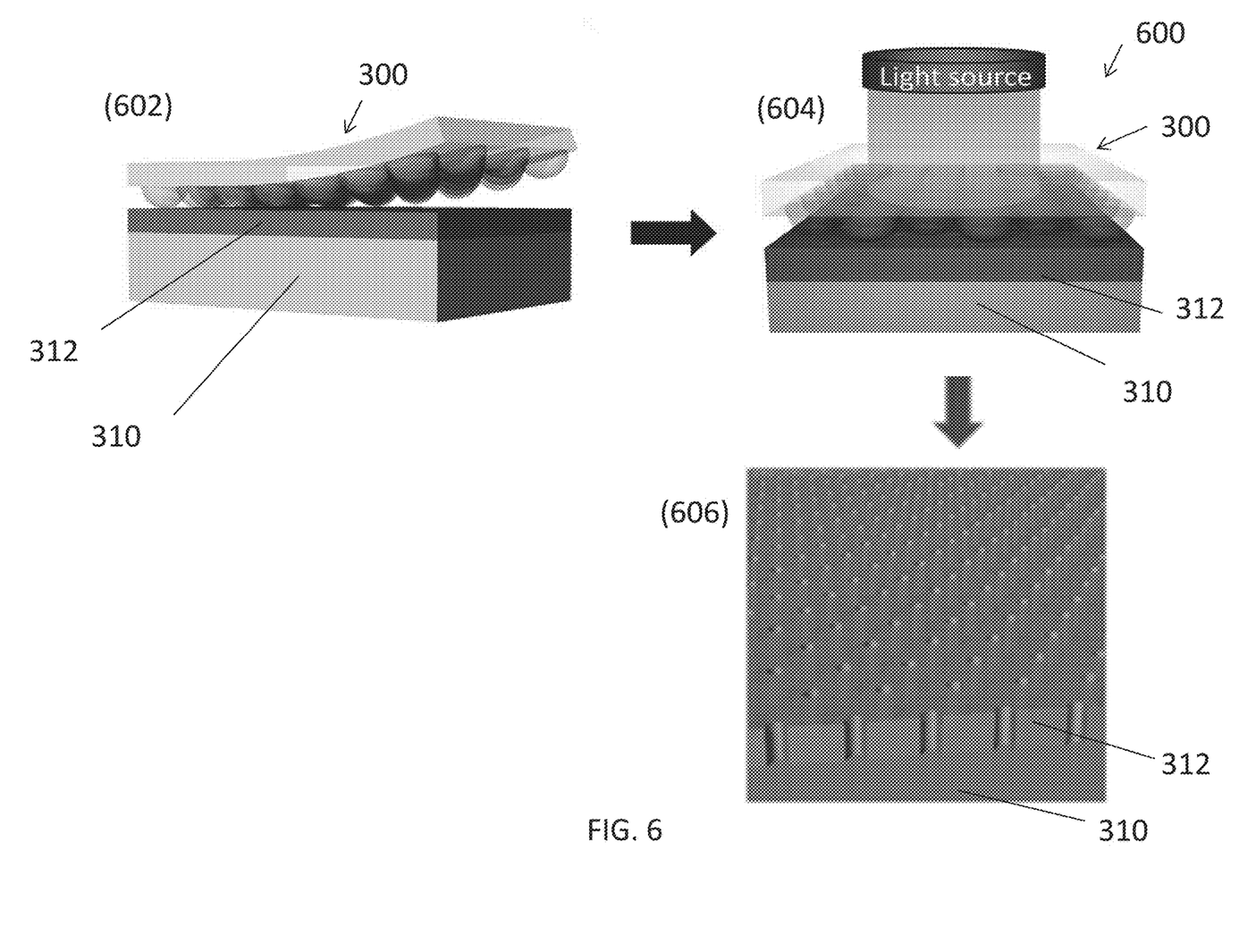
FIG. 6 is a process flow diagram showing an example photolithography process of using the optical mask of FIG. 3 for developing an array of exposure patterns on a photoresist layer.

With reference to FIG. 6, there is shown an embodiment of a method 600 for fabricating an array of patterns on a substrate 310. The method 600 comprises the steps of depositing a layer of photo-sensitive material 312 on the substrate 310; exposing the layer of photo-sensitive material 312 with a uniform optical exposure passing through an optical mask 300; and developing an array of intermediate patterns on the layer of photo-sensitive material 312; wherein the optical mask 300 includes an array of microstructures 302 disposed on a mask substrate 304; and wherein the array of microstructures 302 is arranged to transform the uniform optical exposure passing therethrough to an array of optical exposure patterns.

Preferably, in step 602, a layer of photo-sensitive material 312 such as photoresist (PR) may be deposited on the surface of a substrate 310. In step 604, the photoresist 312 may be exposed to UV light through the optical mask 300 as described in the previous embodiments, so as to receive an array of spots of UV exposure transformed from a uniform UV light source by the optical mask 300. After the exposing the PR 312 with the array of optical exposure patterns, in step 606, an array of intermediate patterns on the layer of photo-sensitive material 312 may be developed upon a development process, for example by soaking and rinsing the photoresist 312 in a PR developer, thereby transferring the pattern of the optical mask 300 to the photoresist layer 312.

Different processing conditions, such as the polystyrene sphere size, the soft polymer composition, the flood UV parameters, the post-exposure/develop treatment, and etc. may be employed and optimized in order to achieve regular and controlled pattern on the polymer mask. In one example process, a photoresist layer of AZ5206E is deposited on a c-plane sapphire substrate 310 with a diameter of 100 mm, with the spin speed of 5000 rpm for 1 min, followed by the soft-bake at 90° C. for 15 min. The illumination with the flood UV is adjusted to 3 s with the post-exposure development in the developer of AZ300MIF for 6 s.

Alternatively, the array of exposure pattern may be applied to other types of photosensitive material, such as but not limited to a positive photoresist layer, a negative photoresist layer or an image-reversal photoresist layer, according different process requirements, and with different exposure parameters as appreciated by a skilled person in the art.

Figure 7:
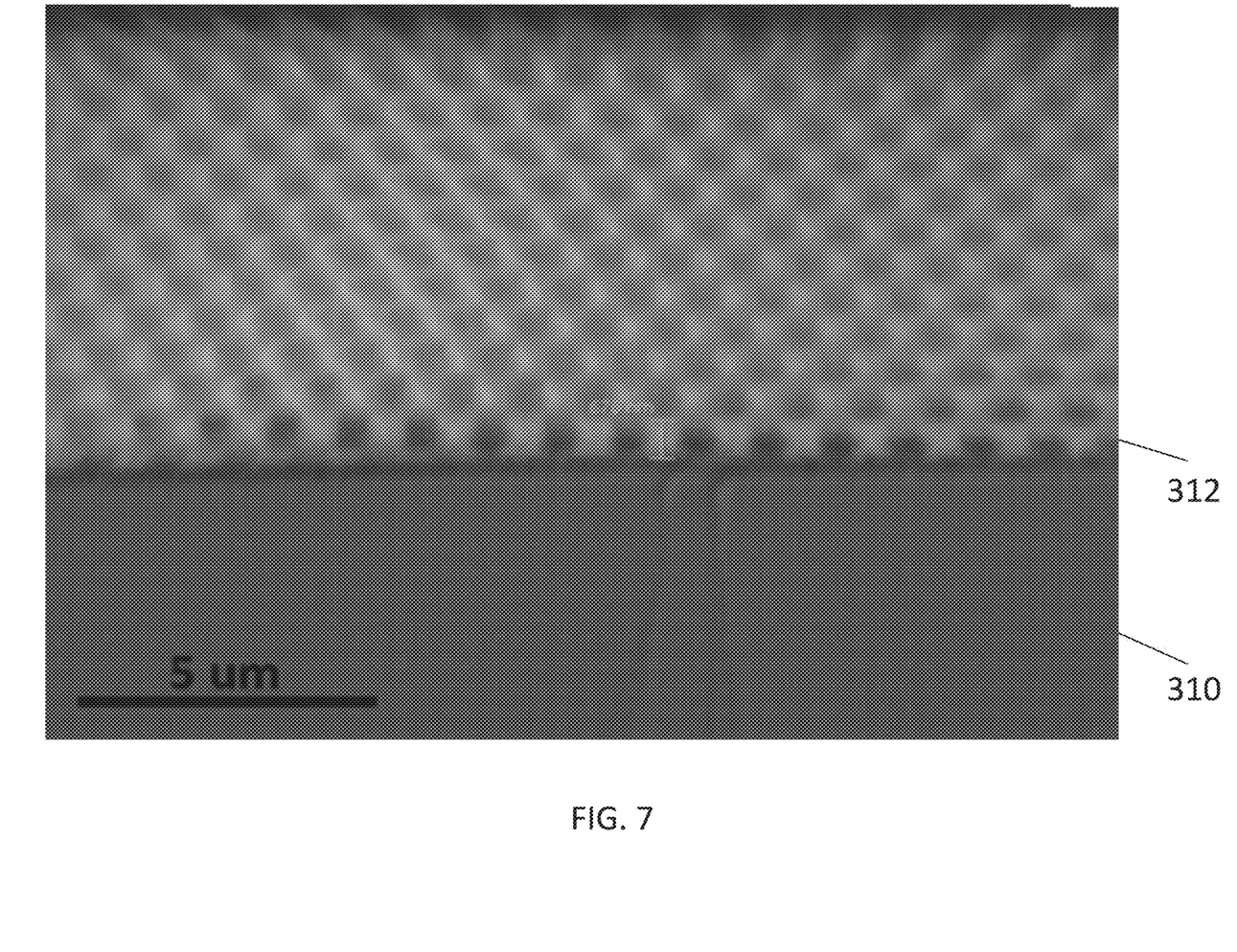
FIG. 7 is an SEM image showing a perspective view of a sapphire substrate with a layer of photoresist thereon, wherein the photoresist layer is developed with an array of patterns transferred from the optical mask of FIG. 5.

With reference to FIG. 7, there is shown an example array of patterns formed on a photoresist layer 312 on the sapphire substrate 310. The starting polystyrene sphere 302 on the optical mask 300 is 1.27 um in diameter which defines the pitch of the array pattern, and the developed resist layer 312 has a thickness of 675 nm. It is obvious that uniform and well-controlled resist patterns are obtained onto the substrate.

Subsequently, the intermediate patterns on the photoresist layer 312 may be further transferred to the layer(s) underneath with an etching process followed by stripping the PR layer 312. In some example fabrication processes, the layer of material underneath the photo-sensitive material 312 may include an etch mask layer, such as a Cr mask or a $SiO_2$ mask to obtain an etching selectivity which may be better when compared to PR for certain material being etched.

In yet an alternative embodiment, the intermediate patterns on patterned PR may be transferred to a layer of material deposited on the layer of photo-sensitive material 312 by a lift-off process. The lift-off process may also be used to pattern an etching mask for further etching process.

In one example, Cr mask may be used in a subsequent dry etching process. The resist pattern is first undergone a mild oxygen plasma treatment (i.e. oxygen flow 50 sccm, power 30 W and duration 45 s) to remove the residual resist at the bottom of the nanohole, so as to improve the uniformity of the masking layer. Then, a composite Ti/Cr (2 nm/30 nm) metal layer is deposited by electron beam evaporation, followed by a lift-off process. This masking layer is next used to transfer the pattern in the dry etching. In the dry etching process, the gas etchant system of $CHF_3$ and $CF_4$ in the flow ratio of 20 sccm:10 sccm is employed with the RF power of 200 W, the Plasma (ICP) power of 400 W, the chamber pressure of 50 mTorr may be applied with a duration of 20 to 40 min.

Figure 8A:
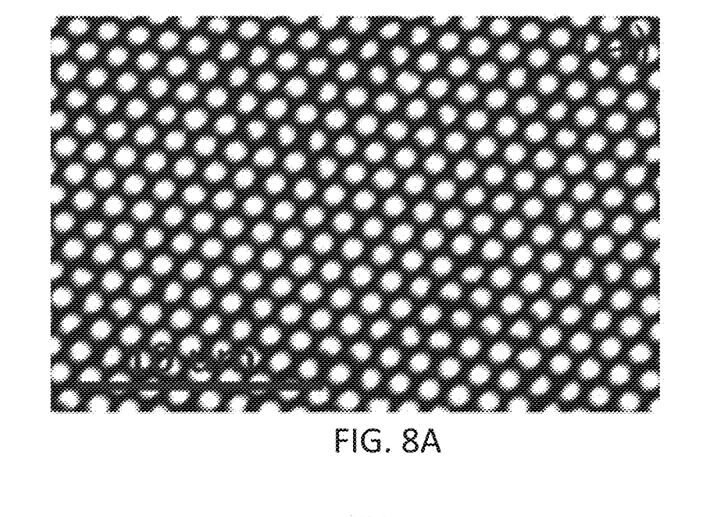
FIGS. 8A, 8B, and 8C are SEM and AFM images showing the finished Cr mask on the sapphire substrate after a dry etching process in accordance with an embodiment of the present invention.
Figure 8B:
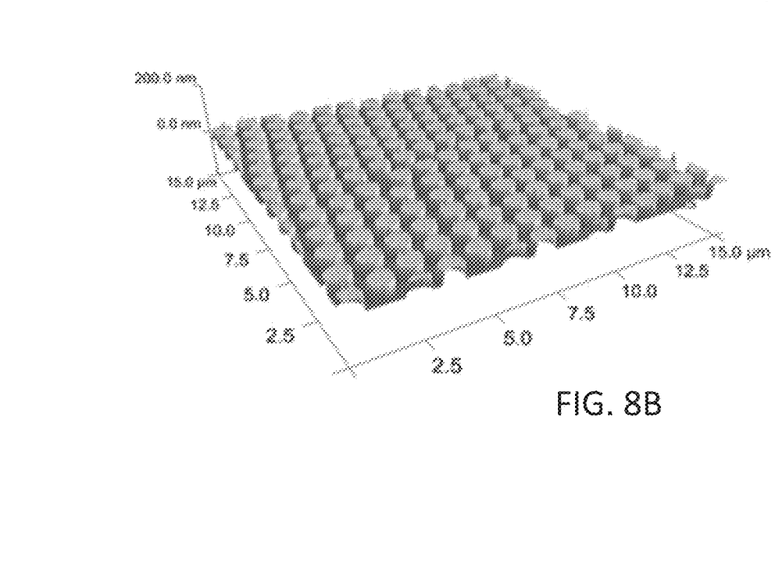
Figure 8C:
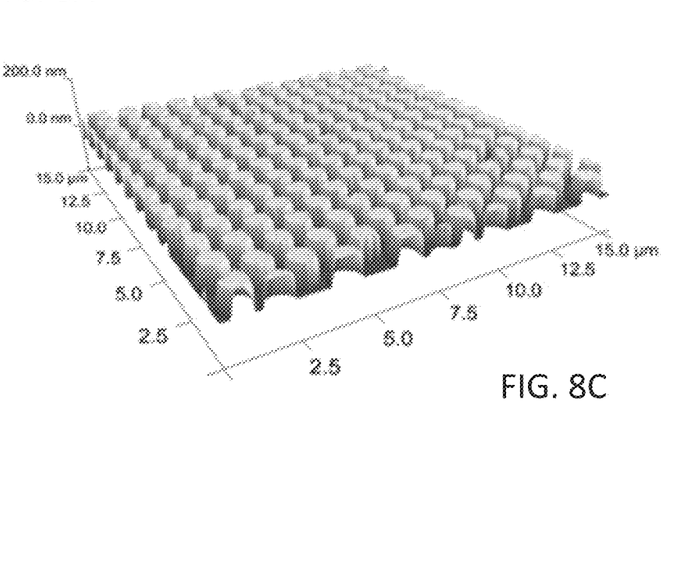
Figure 9A:
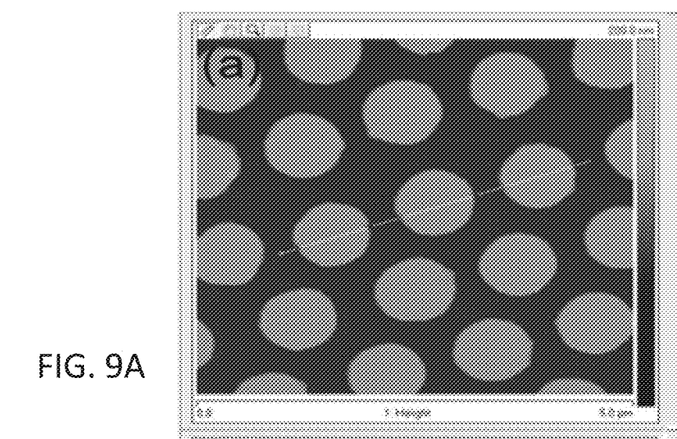
FIGS. 9A, 9B, 9C, and 9D are AFM images and plots showing the morphologies and vertical profile of the finished nanoarrays on the sapphire substrate processed by dry etching in accordance with an embodiment of the present invention.
Figure 9B:
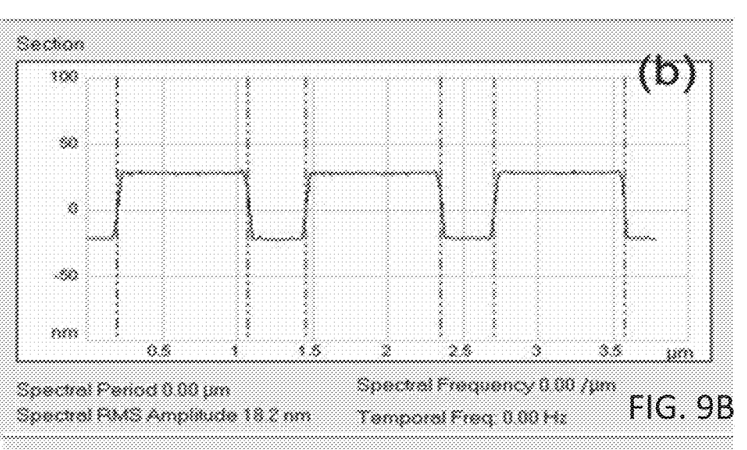
Figure 9C:
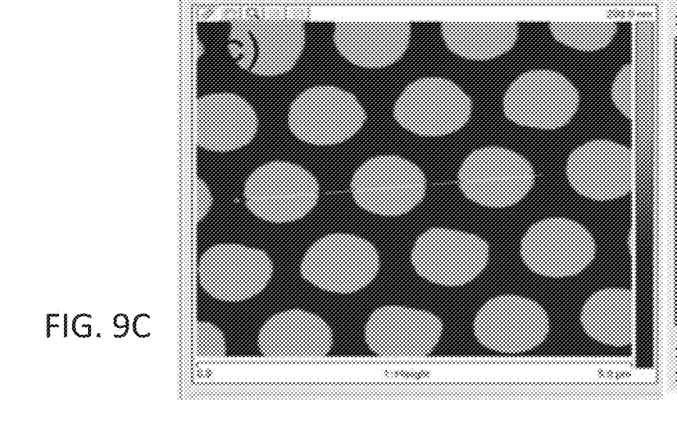
Figure 9D:
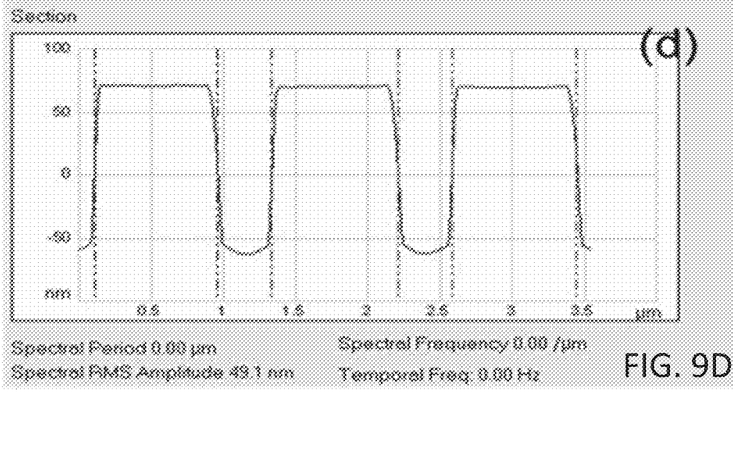

With reference to FIGS. 8A to 8C, there is shown an SEM and two AFM images of the surface of the Cr masking on the etched sapphire substrate. Based on the detailed AFM analysis of the experiment samples referring to FIGS. 9A to 9D, the corresponding feature height has an average of 48.9 and 87.7 nm, and a standard deviation of 1.08 and 1.84 nm, respectively, for the sample etching time of 20 and 30 min. These lead to the statistical coefficient of variation (CV) of 2.2 and 2.1%, accordingly.

In another example, $SiO_2$ masking layer may be applied in an alternative wet etching process. In this example, a 400 nm-thick $SiO_2$ layer may be evaporated onto the finished resist pattern using electron beam evaporation, followed by the lift-off process. After that, the entire substrate is immersed into an etching solution ($H_3PO_4$:$H_2SO_4$=1:3) at 280 to 300° C. for 0.5 to 1.5 hour.

With reference to FIG. 10, by manipulating the etching kinetics, different surface morphologies may be controlled. It is observed that when the etching is performed at 280° C. for 1 hour, pillar like nanostructured arrays may be obtained, with reference to FIGS. 10A to 10C, with an average height of 74.3 nm and a standard deviation of 1.54 nm, corresponding to the CV of 2.1%.

Figure 10A:
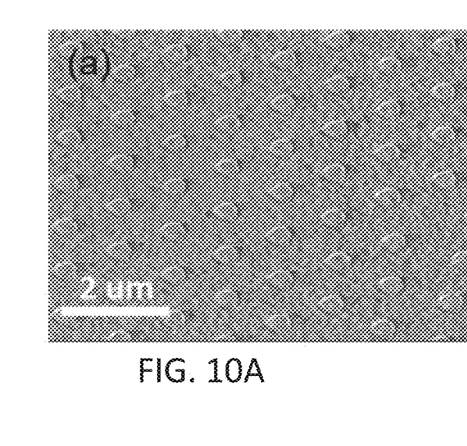
FIGS. 10A, 10B, 10C, 10D, 10E, and 10F are SEM and AFM images showing the finished nanoarrays on the sapphire substrate processed by wet etching with different etching conditions in accordance with an embodiment of the present invention.
Figure 10B:
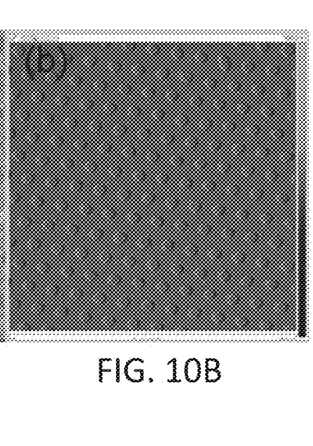
Figure 10C:
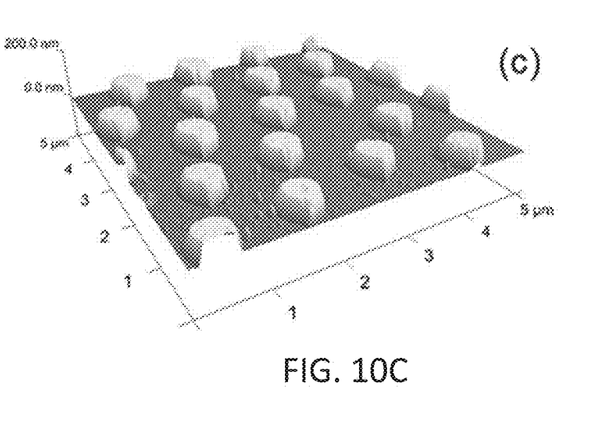
Figure 10D:
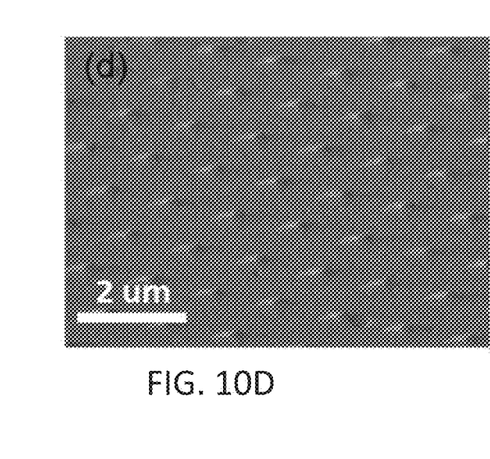
Figure 10E:
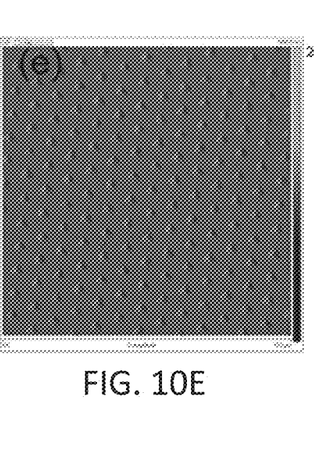
Figure 10F:
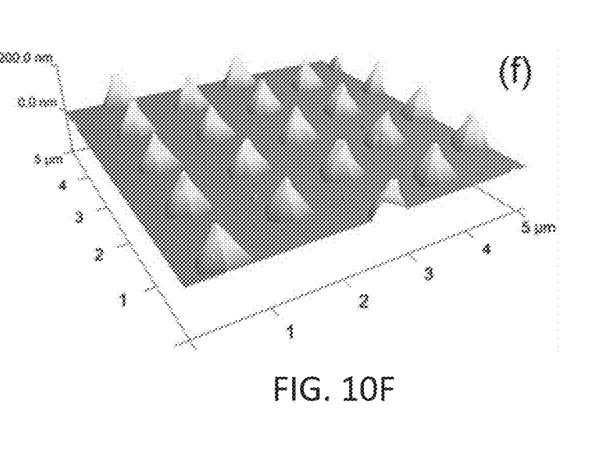

With reference to FIGS. 10D to 10F, by increasing the etching temperature and duration to 300° C. for 1.5 hour, the etching rate can be enhanced to modify the kinetics such that nanostructures with the grading material filling ratio, such as cones or pyramids may be obtained. These arrays have an average height of 112.5 nm and a standard deviation of 8.07 nm, yielding the CV of 7.2%. All these findings indicate the controllability and uniformity of nanostructured arrays fabricated on sapphire substrates for the enhanced PSS technology.

These embodiments may be advantageous in that, the optical mask in accordance with the present invention provides a cost-effective and well-controlled approach to achieve various nanostructured arrays on sapphire substrates as nano-PSS in order to fabricate enhanced LED devices with the improved luminescence efficiency.

Advantageously, with the use of soft polymer photomask (i.e. reusable colloidal photomask) and flood UV illumination, the mechanical flexibility of the polymer can accommodate sapphire substrates with the much larger tolerance in their flatness as compared with the conventional optical lithography process. This way, nanostructured arrays can be readily fabricated on the sapphire surface with well-defined dimension and periodicity.

The fabrication of the soft polymer photomask does not require complex process and processing apparatus for fabricating conventional optical mask (such as a chromium mask). Advantageously, array of patterns may be modified by using different dimensions and materials of the microstructures on the soft optical mask so as to obtain a different dimension of the nanostructures on the sapphire substrates.

The fabrication method in accordance with the embodiments of the present invention may also be applied in defining arrays of pattern in any layer of material in a micro structure, for example in other photonic structures, electronic devices or micro-mechanical structures.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for fabricating an array of patterns on a substrate, comprising the steps of:
   fabricating an optical mask by disposing an array of microstructures on a mask substrate;
   depositing a layer of photo-sensitive material on the substrate;
   exposing the layer of photo-sensitive material with a uniform optical exposure passing through the mask substrate and the microstructures of the optical mask; and
   developing an array of intermediate patterns on the layer of photo-sensitive material;
   wherein each of the microstructures are formed on a surface of the mask substrate as a monolayer, the microstructures are optically transparent and include a refractive index different from that of the mask substrate;
   wherein the array of microstructures is arranged to transform the uniform optical exposure passing therethrough to an array of optical exposure patterns; and
   wherein each of the microstructures is arranged to at least partially converge the uniform optical exposure thereby transforming the uniform optical exposure to the array of optical exposure patterns.

2. The method for fabricating an array of patterns on a substrate in accordance with claim 1, further comprising the step of etching a layer of material underneath the photo-sensitive material so as to transfer the intermediate patterns developed on the photo-sensitive material to the layer of material.

3. The method for fabricating an array of patterns on a substrate in accordance with claim 2, wherein the layer of material underneath the photo-sensitive material is an etching mask layer.

4. The method for fabricating an array of patterns on a substrate in accordance with claim 1, further comprising the step of transferring the intermediate patterns to a layer of material deposited on the layer of photo-sensitive material by a lift-off process.

5. The method for fabricating an array of patterns on a substrate in accordance with claim 1, wherein the substrate includes sapphire.

6. The method for fabricating an array of patterns on a substrate in accordance with claim 1, wherein the array of microstructures defines a self-assembly monolayer of microstructures.

7. The method for fabricating an array of patterns on a substrate in accordance with claim 6, further comprising the step of forming the self-assembly monolayer of microstructures on a solution surface.

8. The method for fabricating an array of patterns on a substrate in accordance with claim 7, wherein the step of disposing the array of microstructures on the intermediate substrate comprising the step of transferring the self-assembly monolayer of microstructures from the solution surface to the intermediate substrate.

9. The method for fabricating an array of patterns on a substrate in accordance with claim 1, further comprising the step of processing the microstructures with oxygen plasma.

10. The method for fabricating an array of patterns on a substrate in accordance with claim 1, wherein the step of transferring the microstructures from the intermediate substrate to the mask substrate comprising the steps of:
   forming the mask substrate on top of the array of microstructures on the intermediate substrate; and
   detaching the intermediate substrate from a combination of the array of microstructure and the mask substrate.

11. The method for fabricating an array of patterns on a substrate in accordance with claim 10, wherein the step of forming the mask substrate comprising the step of curing a precursor of the mask substrate applied over the array of microstructures on the intermediate substrate.

12. The method for fabricating an array of patterns on a substrate in accordance with claim 10, wherein the step of detaching the intermediate substrate from a combination of the array of microstructure and the mask substrate comprising the step of peeling off the mask substrate from the intermediate substrate so as to detach the microstructure from the intermediate substrate.

13. The method for fabricating an array of patterns on a substrate in accordance with claim 1, wherein the intermediate substrate includes an interfacial metal layer arrange to facilitate transferring the microstructures from the intermediate substrate to a mask substrate.

14. The method for fabricating an array of patterns on a substrate in accordance with claim 13, wherein the interfacial metal layer includes a low affinity to the mask substrate.

* * * * *